United States Patent [19]

Harkias

[11] 3,821,881

[45] July 2, 1974

[54] REFRIGERATOR BOX WITH DOOR MOUNTED REFRIGERATION UNIT

[75] Inventor: Alex Harkias, Rolling Hills, Calif.

[73] Assignee: Mobile Metal Products, Inc., Gardena, Calif.

[22] Filed: July 14, 1972

[21] Appl. No.: 272,026

[52] U.S. Cl. .......... 62/3, 62/238

[51] Int. Cl. .......... F25b 21/02

[58] Field of Search .......... 62/3, 238

[56] References Cited

UNITED STATES PATENTS

| | | | |
|---|---|---|---|
| 2,932,953 | 4/1960 | Becket | 62/3 |
| 2,964,912 | 12/1960 | Roeder | 62/3 |
| 3,040,539 | 6/1962 | Gaugler | 62/3 |
| 3,073,127 | 1/1963 | Schmerzler | 62/3 |
| 3,078,682 | 2/1963 | Gould | 62/3 |
| 3,085,405 | 4/1963 | Frantti | 62/3 |
| 3,111,166 | 11/1963 | Munz | 62/3 |
| 3,138,934 | 6/1964 | Roane | 62/3 |
| 3,146,601 | 9/1964 | Gould | 62/3 |
| 3,194,023 | 7/1965 | Sudmeier | 62/3 |
| 3,216,204 | 11/1965 | Milligan | 62/3 |
| 3,232,063 | 2/1966 | Eichhorn | 62/3 |
| 3,302,414 | 2/1967 | Sudmeier | 62/3 |
| 3,351,233 | 11/1967 | Chanoch | 62/3 |
| 3,732,702 | 5/1973 | Desch | 62/3 |
| 3,733,836 | 5/1973 | Coreni | 62/3 |

*Primary Examiner*—William J. Wye
*Attorney, Agent, or Firm*—Edward A. Sokolski

[57] ABSTRACT

A refrigerator box has its refrigeration unit incorporated into the door thereof. A pair of thermoelectric cooling modules are attached to a "cold" bar with their "cold" surfaces abutted thereagainst. Attached to the cold bar is a heat exchanger element having a plurality of fins for effectively cooling the inside of the box, this heat exchanger forming a heat sink which is mounted adjacent to the inside wall of the box door. The "hot" surfaces of the thermoelectric modules are attached to a heat exchanger which has fins, this heat exchanger being mounted adjacent to the outside wall of the door. The second heat exchanger provides a heat sink for dissipating heat energy drawn from and through the thermoelectric modules. An air circulation system is provided by means of a blower mounted adjacent the outside wall of the door for circulating ambient air through the outside heat exchanger. This blower is kept in operation both by power from a power source which is the same one used for the thermoelectric units and by power supplied by the thermoelectric units themselves when the regular power supply is disconnected by the unit's control thermostat.

11 Claims, 5 Drawing Figures

REFRIGERATOR BOX WITH DOOR MOUNTED REFRIGERATION UNIT

This invention relates to refrigerators and more particularly to a refrigerator having a refrigeration unit which is wholly contained within the door thereof and which utilizes thermoelectric modules for cooling.

In refrigerator boxes for use in mobile installations, such as in campers, trailers and boats, it is essential that the unit utilized have minimum power requirements and utilize this power in as efficient a manner as possible, this in view of the fact that a storage battery must generally be relied upon to supply the power needs in such environment. Further, it is necessary that such units be of relatively compact and economical construction. Thermoelectric cooling modules have been developed which appear to provide the answer to a compact economical, low power consumption refrigeration for mobile applications. Prior art refrigerator units utilizing thermoelectric cooling modules have generally been used as auxiliary units mounted in the door of the box, with a main unit mounted in conventional fashion. Certain prior art boxes have utilized thermoelectric units mounted inside the body of the box. This approach has the shortcoming that in the event of a malfunction or failure of the cooling unit, it is necessary to remove the entire box for repair. Further, most prior art devices lack the efficiency of operation and low power consumption that is necessary, particularly in mobile installations.

The device of this invention overcomes the aforementioned shortcomings of the prior art in providing a highly efficient low power consumption cooling unit which is mounted in its entirety in the door of the refrigerator box. Thus, in the event of the failure of such unit, the door along need be removed to effect the necessary repairs. The placement of the refrigerator unit in the door also greatly facilitates production in the units, in that the main bodies of the boxes need not be handled in the installation and testing of the refrigeration components. Further, existing ice box units can be retrofitted with the refrigerator door units of the invention to make for an electric refrigerator, thus saving the expense of an entire new box unit. The refrigeration unit of the invention utilizes a highly efficient heat exchange system to provide optimum utilization of electrical energy.

It is therefore an object of this invention to provide an improved refrigeration unit particularly useful for mobile applications.

It is another object of this invention to facilitate the repair and retrofitting of mobile refrigerator installations.

It is still a further object of this invention to provide a highly efficient refrigerator box which has low power requirements and operates automatically on demand over a wide range of room temperatures.

Other objects of this invention will become apparent as the description proceeds in connection with the accompanying drawings, of which:

Briefly described, the device of the invention comprises a refrigerator box which has a cooling system built into the door thereof. This cooling system utilizes thermoelectric modules which are attached to a "cold" bar with their cool surfaces abutting thereagainst. Heat exchanger elements providing heat sinks are also attached to the thermoelectric modules, these heat exchangers having their surfaces abutting against the "hot" surfaces of the thermoelectric modules. Heat exchanger elements for effecting the cooling action are attached to the cold bar, these elements being mounted along the inside wall of the refrigerator door to cool the inside of the box. Blower means is provided adjacent to the outside wall of the box door to circulate ambient air so as to dissipate heat energy from the heat exchanger elements connected to the hot surfaces of the thermoelectric modules. A thermostat is provided to disconnect the electrical power supply from the thermoelectric modules when a desired temperature has been reached. Under such conditions, the thermoelectric elements generate a sufficient potential to drive the blower means, thus continuing the circulation of air through the heat exchangers until the heat exchangers are at room temperature without consuming power from the power source. It is to be noted that without the fan operating, the heat flow path through the refrigeration unit into the box is impaired because the heat exchanger fins are inside the door and heat is not easily transferred to them.

Figures 1, 2, 5:
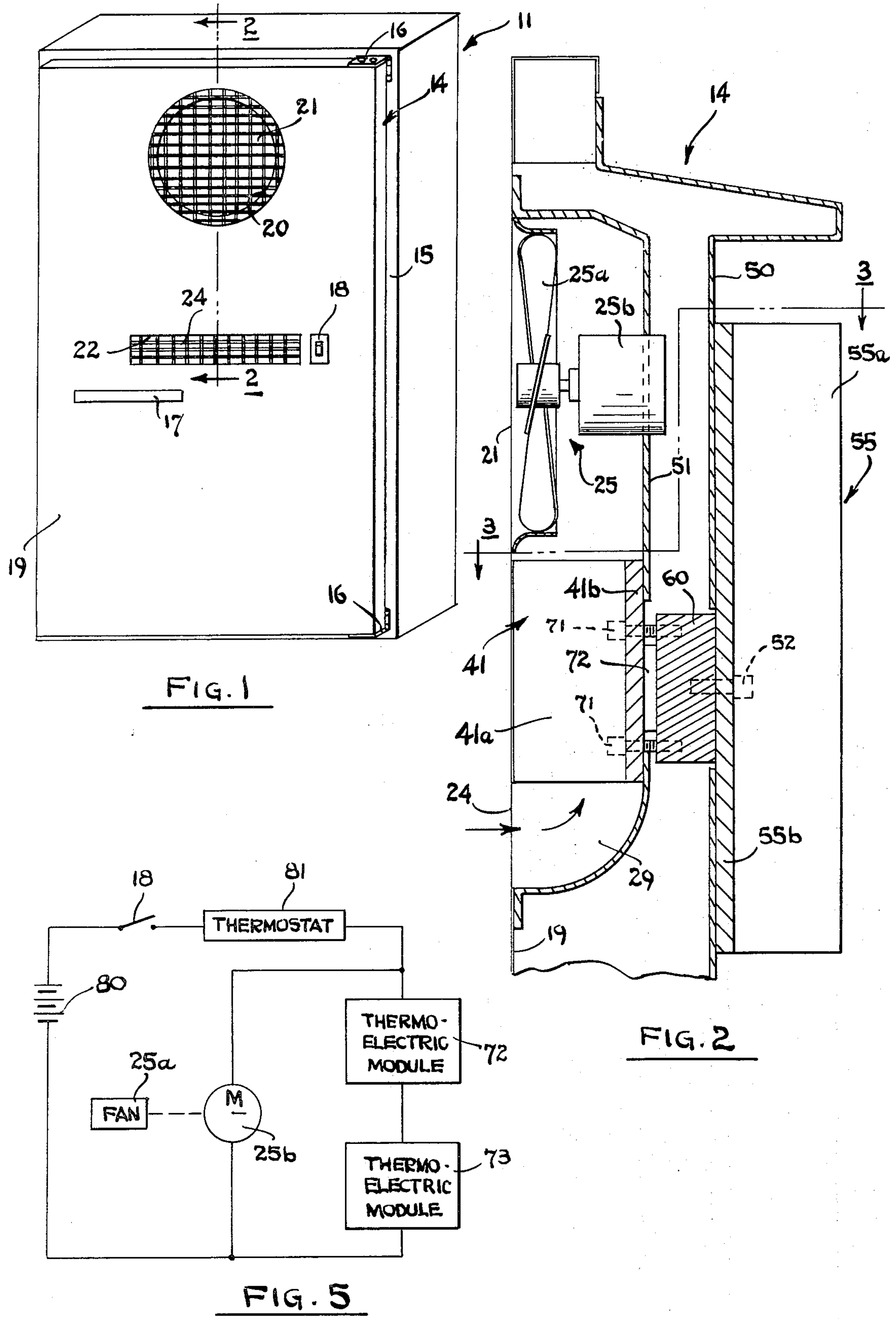
FIG. 1 is a perspective view of one embodiment of the device of the invention.
FIG. 2 is a cross-sectional view taken along the plane indicated by 2—2 in FIG. 1.
FIG. 5 is a schematic drawing illustrating the electrical circuit of the illustrative embodiment.

Referring now to FIGS. 1–4, a preferred embodiment of the invention is illustrated. As shown in FIG. 1, refrigerator box 11 has a hinged front door 14 which is supported on the frame 15 of the box by means of hinges 16. Door 14 is readily detachable from the main body of the box for easy removal for repair or replacement. On the outside wall 19 of door 14 is handle 17 for use in opening and closing the door, and on-off switch 18 for providing power to the cooling system of the refrigeration unit. In the front wall of door 14 is an opening 20 having a screen 21 mounted thereover, and an opening 22 with a screen 24 thereacross. A fan 25 is mounted behind screen 21, while an air space 29 is formed behind screen 24. An air flow path is provided between space 29 and fan 25 for the circulation of the air between screens 21 and 24 through the fins **40*a* and 41*a* of heat exchangers 40 and 41 when fan blades 25*a*** are rotated.

Figure 4:
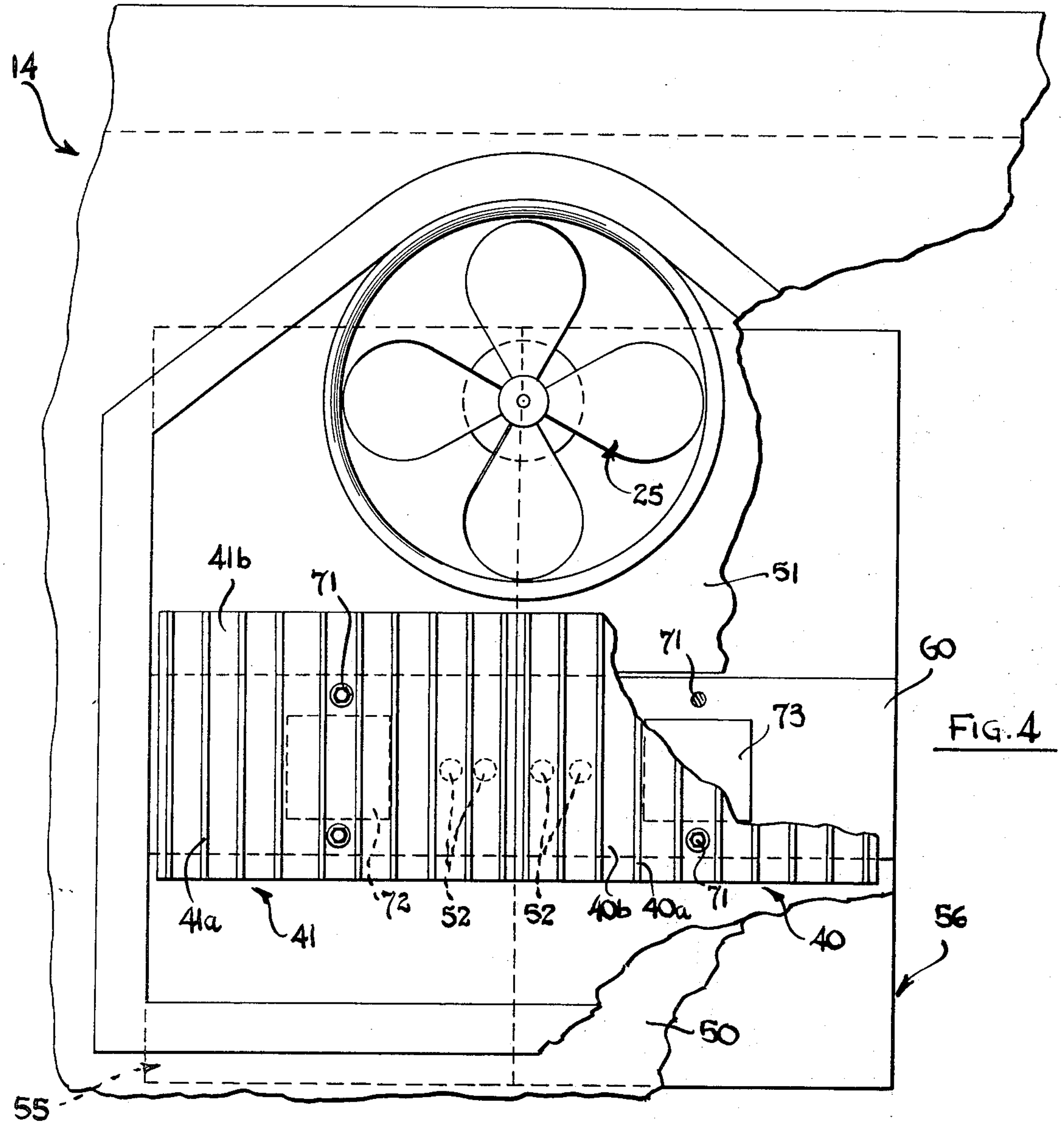
FIG. 4 is an elevational view with partial section cutaway illustrating the cooling system of the illustrative embodiment.
Figure 3:
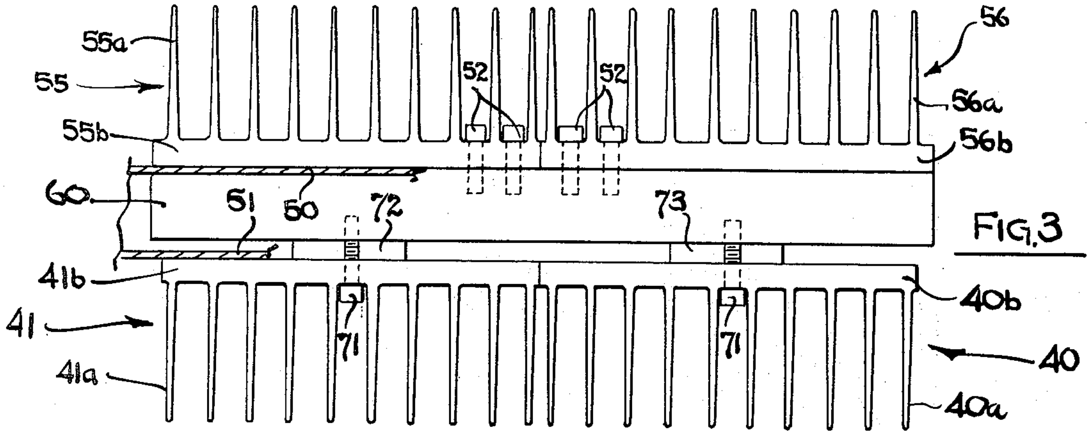
FIG. 3 is a cross-sectional view taken along the plane indicated by 3—3 in FIG. 2.

Referring now particularly to FIGS. 2–4, the refrigeration system of the invention is illustrated in detail. Positioned adjacent to the inside wall 50 of door 14 by virtue of their attachment to "cold" bar 60 are heat exchanger elements 55 and 56. These heat exchanger elements are fabricated of a material having high thermal conductivity and include flat plate portions **55*b* and 56*b* and fin portions 55*a* and 56*a*. Heat exchanger elements 55 and 56** are used to cool the inside of the box.

Heat exchanger elements 55 and 56 are attached, by means of bolts 52, to "cold" bar 60, this bar having one of its broad surfaces abutting against the broad surfaces of flat plate portions **55*b* and 56*b* of the heat exchangers. Cold bar 60** is fabricated of a material having high thermal conductivity.

Sandwiched between cold bar 60 and heat exchanger elements 40 and 41 are thermoelectric cooling modules 72 and 73 respectively. These cooling modules have their "cold" surfaces in tight abutment against bar 60 and their "hot" surfaces soldered to the broad surfaces of plate portions 40*b* and 41*b* of the heat exchangers. Heat exchangers 40 and 41 are similar in construction to heat exchangers 55 and 56, being fabricated of high thermal conductivity material and having fins 40*a* and 41*a* extending from their flat plate portions. Heat exchanger elements 40 and 41 are attached to cold bar 60 by means of insulated bolts 71 which are tightened up to provide good thermal contact between the abutting surfaces of heat exchangers 40 and 41 and the thermoelectric modules. Thus it can be seen that heat exchanger units 55 and 56, cold bar 60, thermoelectric modules 72 and 73, and heat exchanger units 40 and 41 are all connected together to form a composite unit with the adjoining surfaces of these units abutting against each other with good thermal contact therebetween. The composite unit is effectively clamped to the door of the box with flat portions 55*b* and 56*b* of the "cold" heat exchangers abutting against the inside wall 50 of the door and the flat portions 40*b* and 41*b* of the "hot" heat exchangers abutting against middle panel 51 of the door. Thermoelectric modules 72 and 73 may be off-the-shelf units commercially available from Melcor Corporation, Trenton, New Jersey. These units are formed from a plurality of thermocouple elements fabricated from a thermoelectric material such as a quaternary alloy of bismuth, tellurium, selenium and antimony, with small amounts of suitable dopents. It is to be noted that in certain instances the cold bar may be formed integrally with and comprise part of the "cold" heat exchanger elements 55 and 56.

It is to be noted that the combined masses of the "cold" heat exchangers 55 and 56 is substantially greater than the combined masses of the "hot" heat exchangers 40 and 41. The ratio of these masses is designed such that as long as the "hot" heat exchangers have a heat greater than room temperature, the thermoelectric modules will generate sufficient electrical energy to rotate the fan and cool the hot heat exchangers. With the hot heat exchangers installed in the door, natural convection is greatly diminished. Therefore, when the hot heat exchangers are below room temperature, heat transfer through the refrigeration unit into the box is greatly diminished. This optimum mass ratio can be determined empirically by techniques well known in the art.

A fan 25 having fan blades 25*a* driven by motor 25*b* is mounted in door 14 adjacent to the outer wall thereof to provide a circulation of ambient air through the fins 40*a* and 41*a* of heat exchangers 40 and 41 to cool these fins. The fan is driven by power supplied thereto from power source 80 (see FIG. 5) which may comprise a storage battery. As to be explained in connection with FIG. 5, the fan is also driven by electrical energy supplied by the thermoelectric elements 72 and 73 when the box is at the desired cooling temperature and the control thermostat is in its power cut-off condition.

Referring now to FIG. 5, the electrical circuitry of the device of the invention is schematically illustrated. Power is provided for both the thermoelectric modules 72 and 73 and fan motor 25*b* by D-C power source 80, which may comprise the normal storage battery of a vehicle or boat. The power is turned on by means of switch 18, current thus being applied from the power source through thermostat 81 to both the thermoelectric modules and fan motor. Thermostat 81 is placed inside the refrigerator box and when the desired cooling temperature is reached, the thermostat goes to its "cut-off" condition to interrupt the supply of power to the thermoelectric modules and the fan motor. Under these conditions, in view of the temperature differential between the "hot" and "cold" surfaces of the thermoelectric modules, a potential is generated by these modules. This potential is sufficient to drive fan motor 25*b* to continue the cooling action of fan 25*a* until the temperature of the heat exchangers 40 and 41 falls to the ambient temperature. While the power supplied by thermoelectric modules 72 and 73 is considerably less than that from power source 80, it is nevertheless great enough to keep fan 25*a* rotating, though at a reduced speed. Thus, the cooling of the heat exchangers 40 and 41 is continued after the main power is cut off until the temperature of these heat exchangers reaches the ambient temperature. This provides optimum utilization of the available electrical energy in implementing the cooling action.

The device of this invention thus provides a highly efficient refrigerator box having relatively low electrical power requirements which is particularly suitable for use in mobile environments, such as in campers, trailers and boats.

While the device of the invention has been described and illustrated in detail, it is to be clearly understood that this is intended by way of illustration and example only and is not to be taken by way of limitation, the spirit and scope of this invention being limited only by the terms of the following claims.

I claim:

1. In a refrigerator box having a removable door, a refrigeration system mounted in said door comprising:

first heat exchanger means having a plurality of fins, said first heat exchanger means being mounted with the fins thereof adjacent to the outside wall of said door, bar means having high thermal conductivity, thermoelectric means having opposite "hot" and "cold" surfaces, said thermoelectric means being attached to said bar means with the "cold" surface thereof abutting against a surface of the bar means to provide heat transfer therebetween, means for providing electrical energy to said thermoelectric means, means for attaching said bar means to said first heat exchanger means with the thermoelectric means sandwiched therebetween, the "hot" surface of said thermoelectric means abutting against said first heat exchanger means to provide heat transfer therebetween, second heat exchanger means attached to said bar means for transfer of thermal energy therebetween, a surface of said second heat exchanger means abutting against the surface of said bar means opposite to the surface thereof abutting against said thermoelectric means, said second heat exchanger means having fins extending inside said box from the inner wall of said door, said second heat exchanger means having a substantially greater mass than said first heat exchanger means, and means for circulating ambient air through the fins of said first heat exchanger means.

2. The device of claim 1 wherein said means for circulating air comprises a fan mounted adjacent the outside wall of said door above said first heat exchanger means, first aperture means in said wall in front of said fan, and second aperture means in the outside wall of said door adjacent to the fins of said first heat exchanger means, an air circulation path being formed from said first aperture means through said last mentioned fins and said second aperture means, and means for providing electrical energy to rotatably drive said fan to circulate air through said path.

3. The device of claim 2 wherein said means for providing electrical energy to said thermoelectric means and to said fan comprises a D-C power source and a thermostat interposed between said power source and said fan and thermoelectric means, said thermostat being activated to pass power therethrough only when the temperature of the box exceeds a predetermined temperature.

4. The device of claim 3 wherein said fan is rotatably driven by power from said thermoelectric means when said thermostat is deactivated to interrupt the supply of power from said power means.

5. The device of claim 1 wherein said thermoelectric means comprises a pair of thermoelectric modules.

6. The device of claim 1 wherein said first and second heat exchanger means comprises first and second pairs of heat exchanger units, each of said pairs being arranged in side-by-side relationship.

7. In combination, a refrigerator box having a removable door, said door having an inside wall and an outside wall with a pair of apertures formed therein, an electric fan mounted in said door adjacent to said outside wall opposite one of said apertures, first heat exchanger means having fins mounted in said door adjacent to said outside wall between said apertures, a bar having a substantial mass fabricated of a material having high thermal conductivity, a thermoelectric module having opposite "hot" and "cold" surfaces sandwiched between said bar and said first heat exchanger means, the "hot" surface of said module being abutted against said first heat exchanger means, the "cold" surface of said module being abutted against said bar, an electrical power source for providing power for said thermoelectric module, means for attaching said first heat exchanger means to said bar and holding the opposite surfaces of said thermoelectric module in close engagment with the opposing surfaces of said first heat exchanger means and said bar respectively so as to provide efficient thermal transfer therebetween, second heat exchanger means attached to said bar for the transfer of thermal energy therebetween, said second heat exchanger means being adjacent to the inside wall of said door and having fins extending to the inner portion of said box for cooling said box, and means for driving said fan so as to circulate ambient air through the radiating fins of said first heat exchanger means so as to cool said fins, said second heat exchanger means having a substantially greater mass than that of said first heat exchanger means so as to engender a temperature differential across the thermoelectric module when the temperature of said first heat exchanger means is greater than room temperature, the means for driving said fan including said thermoelectric module.

8. The device of claim 7 wherein said first and second heat exchanger means comprises first and second pairs of heat exchanger units respectively, each of said pairs being arranged in side-by-side relationship.

9. The device of claim 7 and additionally including a thermostat which is thermally actuated to interrupt the supply of power from said power source to said thermoelectric module when the inside of the box is below a predetermined temperature.

10. The device of claim 9 wherein the means for driving the fan comprises said thermoelectric module when the thermostat is actuated and said power source at all other times.

11. The device of claim 7 wherein said refrigerator door has a middle panel located between the inside and outside walls thereof, said first and second heat exchanger means being held on said door by clamping engagement with the middle panel and the inside wall of said door respectively.

* * * * *